United States Patent
Liu et al.

(10) Patent No.: US 7,524,235 B2
(45) Date of Patent: Apr. 28, 2009

(54) METHOD OF ELIMINATING SURFACE STRESS OF SILICON WAFER

(76) Inventors: Yuling Liu, Tianjin (CN); Jianxin Zhang, Tianjin (CN); Weiwei Li, Tianjin (CN); Yanyan Huang, Tianjin (CN); Yongchao Bian, Tianjin (CN); Na Liu, Tianjin (CN)

( * ) Notice: Subject to any disclaimer, the term of this patent is extended or adjusted under 35 U.S.C. 154(b) by 0 days.

(21) Appl. No.: 11/753,222

(22) Filed: May 24, 2007

(65) Prior Publication Data
US 2007/0298690 A1    Dec. 27, 2007

(30) Foreign Application Priority Data
Jun. 23, 2006    (CN)    ......... 2006 1 0014440

(51) Int. Cl.
*B24B 1/00* (2006.01)
(52) U.S. Cl. ............ 451/41; 451/63; 257/622; 257/E23.194; 438/42
(58) Field of Classification Search ............ 451/28, 451/41, 63; 125/12; 257/622, 627, 653, 257/E21.66, E21.044, E21.634, E23.194; 360/135; 359/848; 438/42, 700, 795
See application file for complete search history.

(56) References Cited

U.S. PATENT DOCUMENTS

| | | | | |
|---|---|---|---|---|
| 3,762,644 | A  * | 10/1973 | Mikeska | 239/265.11 |
| 4,421,386 | A  * | 12/1983 | Podgorski | 359/894 |
| 4,622,574 | A  * | 11/1986 | Garcia | 257/627 |
| 4,785,444 | A  * | 11/1988 | Nakane et al. | 369/282 |
| 5,000,811 | A  * | 3/1991 | Campanelli | 156/264 |
| 5,711,702 | A  * | 1/1998 | Devlin | 451/540 |
| 5,777,832 | A  * | 7/1998 | Yi et al. | 360/135 |
| 6,271,602 | B1 * | 8/2001 | Ackmann et al. | 257/797 |
| 6,595,064 | B2 * | 7/2003 | Drewes et al. | 73/718 |
| 6,979,877 | B1 * | 12/2005 | Li | 257/510 |
| 7,357,690 | B2 * | 4/2008 | Tsuruoka et al. | 445/49 |
| 2002/0145647 | A1* | 10/2002 | Kataoka et al. | 347/65 |
| 2003/0222353 | A1* | 12/2003 | Yamada | 257/774 |
| 2006/0192328 | A1* | 8/2006 | Morrison et al. | 267/140.13 |
| 2007/0047609 | A1* | 3/2007 | Francis et al. | 372/50.21 |

* cited by examiner

*Primary Examiner*—Eileen P. Morgan
(74) *Attorney, Agent, or Firm*—Matthias Scholl P.C.; Matthias Scholl

(57) ABSTRACT

This invention provides a method for eliminating the surface stress of a silicon wafer comprising forming one or more anti-stress groove(s) on the surface of the silicon wafer. These anti-stress grooves can reduce or eliminate the surface stress of silicon wafer effectively to avoid the formation of slip lines and dislocation arrangements, which may induce the p-n junction to conduct or the leakage current to increase. The process is highly efficient and low in cost. It is simple to manage and does not require additional equipment beyond that already used for processing of silicon wafers.

17 Claims, 1 Drawing Sheet

METHOD OF ELIMINATING SURFACE STRESS OF SILICON WAFER

CROSS-REFERENCE TO RELATED APPLICATIONS

Pursuant to 35 U.S.C. § 119 and the Paris Convention Treaty, this application claims the benefit of Chinese Patent Application No. 200610014440.8 filed Jun. 23, 2006, the contents of which are incorporated herein by reference.

BACKGROUND OF THE INVENTION

1. Technical field

This invention relates to semiconductor technology, and especially to a method of eliminating surface stress of a silicon wafer.

2. Background of the Invention

Research indicates that about 98% of the remnant stress of a silicon wafer as substrate for ultra large-scale integrated circuits (ULSI) arises during mechanical processing of silicon wafers, incl. slicing, grinding, rounding, and chamfer.

Because silicon undergoes strong mechanical deformations during the molding process, the edge area of a wafer can be damaged as stress centralizes therein and produces cracks and micro splits. The surface tension on a silicon wafer induces the stress to extend from the surface and the edge to the center and the mechanical action will accelerate the stress extension during grinding, polishing and transport.

The remnant stress can do harm to a wafer in the following ways: (1) cracks or crashes form as the stress exceeds a critical value; (2) glide lines or dislocation alignments form during epitaxial growth or oxidation at high temperature; (3) conduction of the p-n junctions arises in stress centralized areas because of excess diffusion; and (4) increase in the leakage current is realized because of metallic ion impurity conglomeration in stress-centralized areas.

At present, polishing is used to remove remnant stress. However, mechanical action of polishing may lead to new damage and migration of stress to deeper levels of the wafer, which may be even more difficult to eliminate.

BRIEF SUMMARY OF THE INVENTION

In one aspect of the invention provided is a method for overcoming the shortcomings of the conventional remnant stress removal techniques. The method comprises decentralizing and decomposing the remnant stress and preventing the surface stress centralized area from expanding in order to eliminate the surface stress of the silicon wafer.

In certain embodiments of the invention, the method of eliminating surface stress on a silicon wafer comprises forming anti-stress grooves on the silicon surface after the initial silicon processing, such as slicing and grinding.

In certain embodiments of the invention, the radius of the anti-stress groove(s) satisfies the following equation:

$$R_i = k*i$$

wherein i is the groove number counting from the centre of the wafer to the edge of the wafer starting with 1; $R_i$ is the radius of the $i^{th}$ groove; and k is a constant in the range from 10 to 13 mm.

In certain embodiments of the invention, the outermost anti-stress groove is disposed not closer than about 2-3 mm from the edge of wafer, and 0.5-1 mm from the wafer flat (straight edge on the wafer's outer perimeter).

In certain embodiments, the depth of the anti-stress grooves is about 2-10% of the silicon wafer thickness.

In certain embodiments of the invention, the groove angle, i.e., the angle at which the side of the groove forms with a line normal to the wafer surface, is about 10 to 50 degrees.

In certain embodiments of the invention, the groves are formed on the wafer surface by using a force of from 2 to 5 kg-force per square meter.

In certain embodiments, the anti-stress groove(s) can reduce or eliminate the surface stress of silicon wafer effectively to avoid a slip line and dislocation arrangement, which may induce the p-n junctions to conduct or to increase the leakage current. The formation of anti-stress groove(s) is of low cost and is a highly efficient process. It is simple to operate and there is no need to replace or substitute the existing silicon processing equipments.

BRIEF DESCRIPTION OF THE DRAWINGS

Below, the invention is explained in more detail with reference to accompanying drawings, in which.

DETAILED DESCRIPTION OF THE INVENTION

Figure 1:
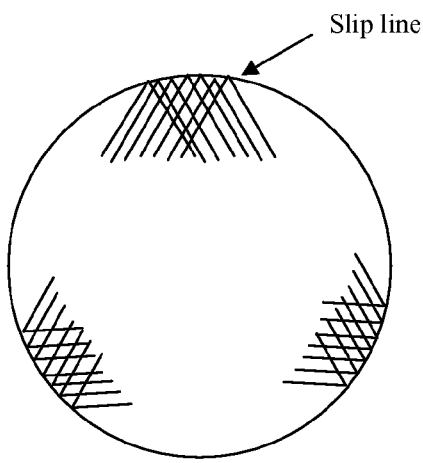
FIG. 1 illustrates slip lines on a silicon wafer surface.
Figure 2:
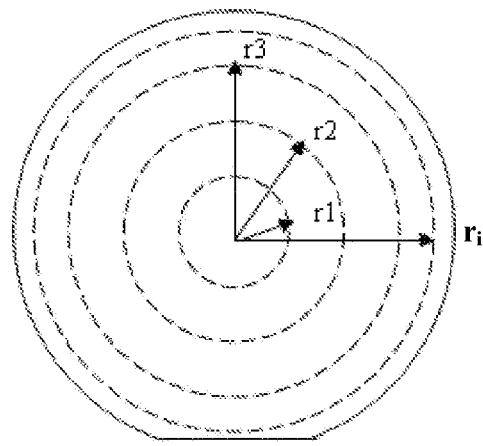
FIG. 2 illustrates the distribution of anti-stress grooves.
Figure 3:
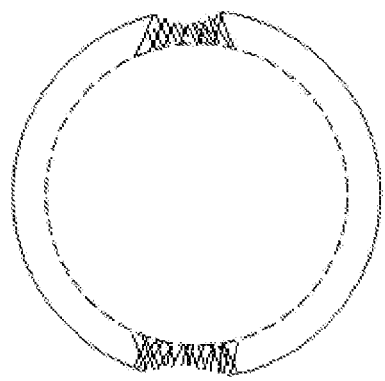
FIG. 3 illustrates the effect of a closed anti-stress groove on the formation of slip lines.
Figure 4:
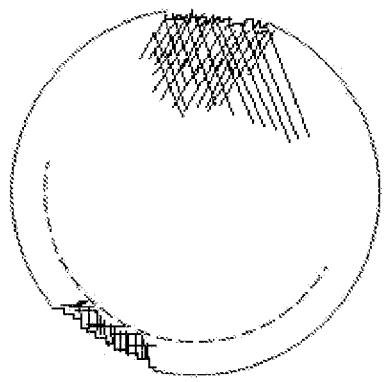
FIG. 4 illustrates the effect of an open anti-stress groove on the formation of slip lines.

A method of eliminating surface stress in a silicon wafer comprises scoring an anti-damage circular groove on the silicon surface of the wafer.

The number of grooves is related to the diameter of the silicon wafer and can be expressed by the following formula:

$$N = (k\phi - n)/m$$

wherein k (in $mm^{-1}$), n, m are constants and $\phi$ is the radius of silicon wafer (in mm).

The radius of the outermost groove is no closer than 2-3 mm from the edge of wafer, and at most 0.5-1 mm from the wafer flat. The depth of the anti-stress grooves is about 2-10% of the silicon wafer thickness. The groove angle is about 10 to 50 degrees. The pressure used to create the grooves is 2-5 kg-force per square meter.

EXAMPLES

Example 1

The Effect of a Closed Anti-stress Groove on the Formation of Slip Lines

A silicon wafer with radius $\phi=35$ mm and resistivity of $2\text{-}3 \times 10^3$ Ω·cm was used in the experiment. The wafer was grinded and epitaxial growth was completed at 1200° C. Thereafter, a closed anti-stress groove was scored with a diamond blade at 3 mm from the edge of wafer. No slip lines were observed.

Example 2

The Effect of Two Closed Anti-stress Grooves on the Formation of Slip Lines Two uniform wafers, A and B, with radius $\phi=50$ mm and resistivity $2\text{-}3 \times 10^3$ Ω·cm were studied. Wafer A was scored with one groove at 3 mm from the edge of wafer, while wafer B was scored with two grooves: one at 3 mm from the edge of the wafer and the other at 12.5 mm from the center of the wafer. Thereafter, the wafers were grinded and epitaxial growth was completed at 1200° C. On wafer A, no slip lines were observed within 20 mm from edge, but there was a shallow slip line close to the wafer centre. On wafer B, no slip lines were observed.

Example 3

The Effect of Several Closed Anti-stress Grooves on the Formation of Slip Lines

Two uniform wafers, A and B, with radius $\phi=100$ mm and resistivity $2\text{-}3\times10^3 \Omega\cdot\text{cm}$ were studied. Wafer A was scored with two grooves: one at 3 mm from the edge of wafer and the other at 37.5 mm from the center. Wafer B was scored with four grooves: one at 3 mm from the edge of wafer, and the other ones at 2.5 mm, 25 mm and 37.5 mm from the center, respectively. Thereafter, the wafers were grinded and epitaxial growth was completed at 1200° C. On wafer A, no slip lines were observed within 60 mm from edge, but there was a shallow slip line close to the wafer centre. On wafer B, no slip lines were observed.

This invention is not to be limited to the specific embodiments disclosed herein and modifications for various applications and other embodiments are intended to be included within the scope of the appended claims. While this invention has been described in connection with particular examples thereof, the true scope of the invention should not be so limited since other modifications will become apparent to the skilled practitioner upon a study of the drawings, specification, and following claims.

All publications and patent applications mentioned in this specification are indicative of the level of skill of those skilled in the art to which this invention pertains. All publications and patent applications mentioned in this specification are herein incorporated by reference to the same extent as if each individual publication or patent application mentioned in this specification was specifically and individually indicated to be incorporated by reference.

What is claimed is:

1. A method of eliminating surface stress of silicon wafer comprising forming one or more anti-stress groove(s) on the silicon surface of the silicon wafer, wherein said anti-stress groove(s) have a depth of 2-10% with respect to a thickness of the silicon wafer, wherein:
    the anti-stress grooves formed on the silicon surface of the silicon wafer are in the form of circles;
    the circles satisfy the following equation: $R_i=k*i$,
    i is a groove number counting from the centre of the wafer to the edge of the wafer starting with 1;
    $R_i$ is the radius of the $i^{th}$ groove (in mm); and
    k is a constant in the range from 10 to 13 mm.

2. The method of claim 1, wherein said anti-stress groove(s) are formed after the silicon wafer is processed by slicing and/or grinding.

3. The method of claim 1, wherein the anti-stress groove(s) that is closest to wafer's edge is disposed not closer than 2-3 mm from the wafer's edge and not closer than 0.5-1 mm from wafer's flat.

4. The method of claim 1, wherein said anti-stress groove(s) are shaped like a trench, the sides of said trench forming a 10-50 degrees angle with the normal to the silicon wafer.

5. The method of claim 1, wherein said anti-stress groove(s) are formed by cutting the silicon wafer with a diamond blade.

6. The method of claim 5, wherein said diamond blade is applied to the surface of the silicon wafer with a pressure of 2-5 kg-force per square meter.

7. A method of eliminating surface stress of silicon wafer comprising forming one or more anti-stress grooves on the silicon surface of the silicon wafer, wherein
    the anti-stress grooves formed on the silicon surface of the silicon wafer have a depth of 2-10% with respect to a thickness of the silicon wafer and are in the form of circles;
    the circles satisfy the following equation: $R_i k*i$,
    i is a groove number counting from the centre of the wafer to the edge of the wafer starting with 1;
    $R_i$ is the radius of the $i^{th}$ groove (in mm); and
    k is a constant in the range from 10 to 13 mm.

8. The method of claim 7, wherein said anti-stress groove(s) are formed after the silicon wafer is processed by slicing and/or grinding.

9. The method of claim 7, wherein the anti-stress groove(s) that is closest to wafer's edge is disposed not closer than 2-3 mm from the wafer's edge and not closer than 0.5-1 mm from wafer's flat.

10. The method of claim 7, wherein said anti-stress groove(s) are shaped like a trench, the sides of said trench forming a 10-50 degrees angle with the normal to the silicon wafer.

11. The method of claim 7, wherein said anti-stress groove(s) are formed by cutting the silicon wafer with a diamond blade.

12. The method of claim 11, wherein said diamond blade is applied to the surface of the silicon wafer with a pressure of 2-5 kg-force per square meter.

13. A method of eliminating surface stress of silicon wafer comprising forming one or more anti-stress groove(s) on a circular silicon surface of the silicon wafer, wherein
    said anti-stress grove(s) have a depth of 2-10% with respect to a thickness of the silicon wafer;
    the anti-stress grooves formed on the silicon surface of the silicon wafer are in the form of circles;
    the circles satisfy the following equation: $R_i k*i$,
    i is a groove number counting from the centre of the wafer to the edge of the wafer starting with 1;
    $R_i$ is the radius of the $i^{th}$ groove (in mm); and
    k is a constant in the range from 10 to 13 mm; and
    said anti-stress grove(s) are shaped like a trench, the sides of said trench forming a 10-50 degrees angle with the normal to the silicon wafer.

14. The method of claim 13, wherein
    said anti-stress groove(s) are formed by cutting the silicon wafer with a diamond blade; and
    said diamond blade is applied to the surface of the silicon wafer with a pressure of 2-5 kg-force per square meter.

15. The method of claim 13, wherein the anti-stress groove(s) that is closest to wafer's edge is disposed not closer than 2-3 mm from the wafer's edge and not closer than 0.5-1 mm from wafer's flat.

16. The method of claim 13, wherein said anti-stress groove(s) are formed after the silicon wafer is processed by slicing and/or grinding.

17. The method of claim 12, wherein said anti-stress groove(s) are formed only on one surface of the silicon wafer.

* * * * *